United States Patent
Ishikawa et al.

(10) Patent No.: US 12,148,140 B2
(45) Date of Patent: Nov. 19, 2024

(54) PROCESS CONDITION ESTIMATING APPARATUS, METHOD, AND PROGRAM

(71) Applicant: ALITECS Corporation, Saitama (JP)

(72) Inventors: Akio Ishikawa, Tokyo (JP); Shuichi Tamamushi, Tokyo (JP)

(73) Assignee: ALITECS CORPORATION, Saitama (JP)

( * ) Notice: Subject to any disclaimer, the term of this patent is extended or adjusted under 35 U.S.C. 154(b) by 394 days.

(21) Appl. No.: 17/729,044

(22) Filed: Apr. 26, 2022

(65) Prior Publication Data

US 2022/0254009 A1   Aug. 11, 2022

Related U.S. Application Data

(63) Continuation of application No. PCT/JP2020/040589, filed on Oct. 29, 2020.

(30) Foreign Application Priority Data

Oct. 30, 2019 (JP) .................................. 2019-197402

(51) Int. Cl.
*G06T 7/00* (2017.01)

(52) U.S. Cl.
CPC .. *G06T 7/0004* (2013.01); *G06T 2207/20084* (2013.01); *G06T 2207/30148* (2013.01)

(58) Field of Classification Search
CPC ......... G06T 7/0004; G06T 2207/20084; G06T 2207/30148; G06T 2207/10061; G03F 7/705; G03F 7/70525; G03F 7/70616
USPC ....................................................... 382/145
See application file for complete search history.

(56) References Cited

U.S. PATENT DOCUMENTS

| | | | |
|---|---|---|---|
| 9,262,819 B1* | 2/2016 | Kagalwala | H01J 37/28 |
| 10,310,371 B2* | 6/2019 | Ye | G03F 7/705 |
| 2016/0003609 A1* | 1/2016 | Shchegrov | G03F 7/705 |
| | | | 356/625 |
| 2017/0206648 A1* | 7/2017 | Marra | B64D 47/08 |

(Continued)

FOREIGN PATENT DOCUMENTS

| | | |
|---|---|---|
| JP | H5-190458 A | 7/1993 |
| JP | H05190458 A * | 7/1993 |

(Continued)

OTHER PUBLICATIONS

International Search Report and Written Opinion from International Patent Application No. PCT/JP2020/040589, dated Jan. 26, 2021.

(Continued)

*Primary Examiner* — Mahendra R Patel
(74) *Attorney, Agent, or Firm* — Potomac Law Group, PLLC

(57) ABSTRACT

A technique for estimating a process condition without limiting forms (such as shapes) of an object is presented, and a process condition estimating apparatus for estimating a process condition in which an object is processed, and which includes an input unit configured to input measurement data acquired at a predetermined position of the object; and an estimation unit configured to estimate the process condition from the measurement data, based on a process-condition-estimating function for inputting the measurement data and outputting an estimation value of the process condition.

15 Claims, 11 Drawing Sheets

(56) References Cited

U.S. PATENT DOCUMENTS

| | | | |
|---|---|---|---|
| 2019/0295827 A1* | 9/2019 | Ohmori | G05B 19/4155 |
| 2019/0369605 A1* | 12/2019 | Nakada | G05B 19/41865 |
| 2022/0139788 A1* | 5/2022 | Okuyama | G06Q 50/04 |
| | | | 702/167 |

FOREIGN PATENT DOCUMENTS

| | | | | | |
|---|---|---|---|---|---|
| JP | 2004021898 | A | * | 1/2004 | G06Q 10/06 |
| JP | 2007-208245 | A | | 8/2007 | |
| JP | 2011044592 | A | * | 3/2011 | |
| JP | 2017049047 | A | * | 3/2017 | |
| JP | 2019165123 | A | * | 9/2019 | G05B 19/4155 |
| JP | 2020138279 | A | * | 9/2020 | G05B 19/4065 |
| JP | 7206961 | B2 | * | 1/2023 | |
| WO | WO-2005081069 | A1 | * | 9/2005 | G01N 21/278 |
| WO | WO-2005103827 | A1 | * | 11/2005 | G03F 1/70 |
| WO | WO-2019070600 | A1 | * | 4/2019 | G06K 9/00 |
| WO | WO-2021024402 | A1 | * | 2/2021 | G01B 15/04 |

OTHER PUBLICATIONS

Office Action issued Apr. 5, 2022, in Japanese Patent Application No. 2021-553677.

* cited by examiner

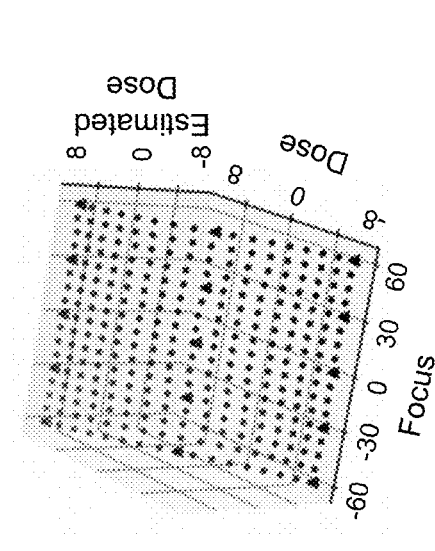
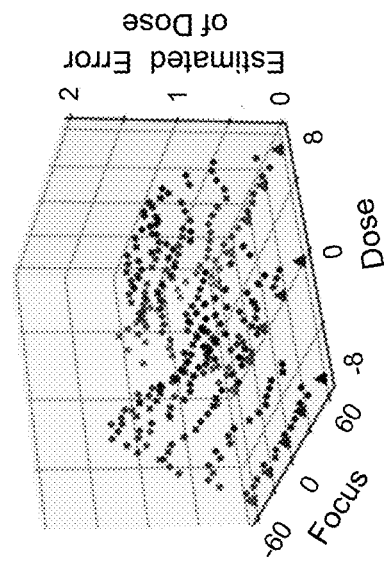
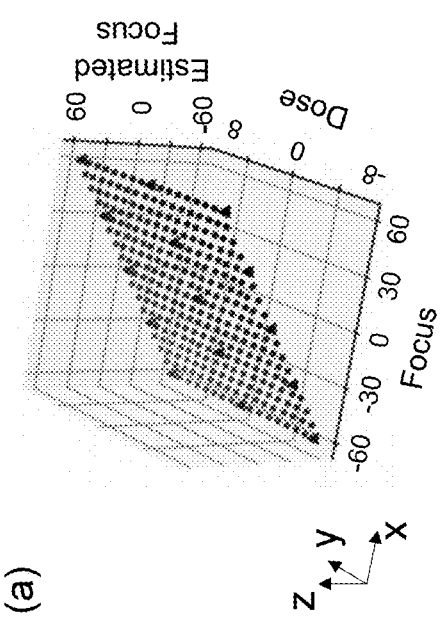
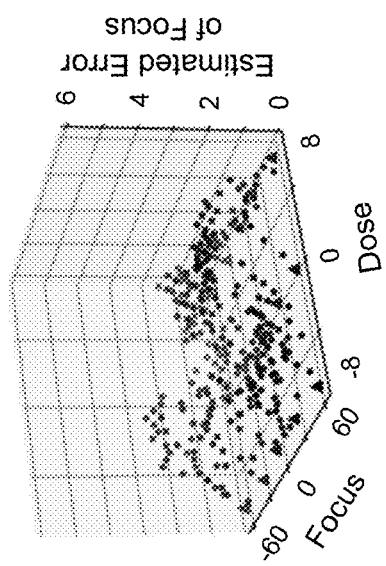
Fig. 10

PROCESS CONDITION ESTIMATING APPARATUS, METHOD, AND PROGRAM

TECHNICAL FIELD

The invention relates to techniques for estimating a process condition, without limiting forms (such as shapes) of an object, from measurement data of the object processed by a processing device.

BACKGROUND

Fine processing technologies for manufacturing semiconductor devices have been developing, resulting in the processing margins becoming increasingly smaller. It is important therefore to confirm whether an object processed by a processing device, such as an exposure device, is processed within a predetermined range.

In general, an optimum exposure condition is determined by measuring a pattern shape, such as a predetermined resist, in a pattern-measuring device, such as a scanning electron microscope (CD-SEM; Critical Dimension-Scanning Electron Microscope). In such a case, not only the resist-pattern shape, but also the pattern shape after etching, is measured, and both pattern shapes are confirmed.

Patent document 1 discloses a technique for calculating an offset amount of a focus and a dose of the exposure device from a gap amount between a line width of a resist-pattern shape and a reference value obtained by a CD-SEM.

RELATED ART

Patent Documents

Patent document 1: JP 2007-208245 A

SUMMARY

Technical Problem

Unfortunately, the simulation determines which shape of the resist pattern is used as a reference, and the reference is fixed. In addition, there is a problem that a resist pattern to be an object is of a predetermined shape, such as a width of a straight line and a diameter of a contact hole.

One or more embodiments of the instant invention focus on solving such a problem. An object of the invention is to provide a technique for estimating a process condition without limiting the forms (such as shapes) of the object.

Solution to Problem

The first embodiment is a process condition estimating apparatus for estimating a process condition in which an object is processed. The apparatus includes an input unit configured to input measurement data, that has a number of dimensions greater than the number of types of the process conditions, acquired at a predetermined position of the object; and an estimation unit configured to estimate the process condition from the measurement data, by performing dimension reduction to the same number of dimensions as the number of types of the process conditions, based on a process-condition-estimating function for inputting the measurement data and outputting an estimation value of the process condition.

The second embodiment is a process condition estimating method for estimating a process condition in which an object is processed. The method includes inputting measurement data, that has a number of dimensions greater than the number of types of the process conditions, acquired at a predetermined position of the object; and estimating the process condition from the measurement data, by performing dimension reduction to the same number of dimensions as the number of types of the process conditions, based on a process-condition-estimating function for inputting the measurement data and outputting an estimation value of the process condition.

The third embodiment is a process condition estimating program for estimating a process condition in which an object is processed, executed by a computer. The program includes a step of inputting measurement data, that has a number of dimensions greater than the number of types of the process conditions, acquired at a predetermined position of the object; and a step of estimating the process condition from the measurement data, by performing dimension reduction to the same number of dimensions as the number of types of the process conditions, based on a process-condition-estimating function for inputting the measurement data and outputting an estimation value of the process condition.

Advantage

One or more embodiments provide a technique for estimating a process condition without limiting the forms (such as shapes) of the object.

BRIEF DESCRIPTION OF DRAWINGS

FIG. 10 are graphs showing amounts or errors estimated by the focus and the dose (Case 1: without re-learning).

DETAILED DESCRIPTION OF EMBODIMENTS

Figure 1:
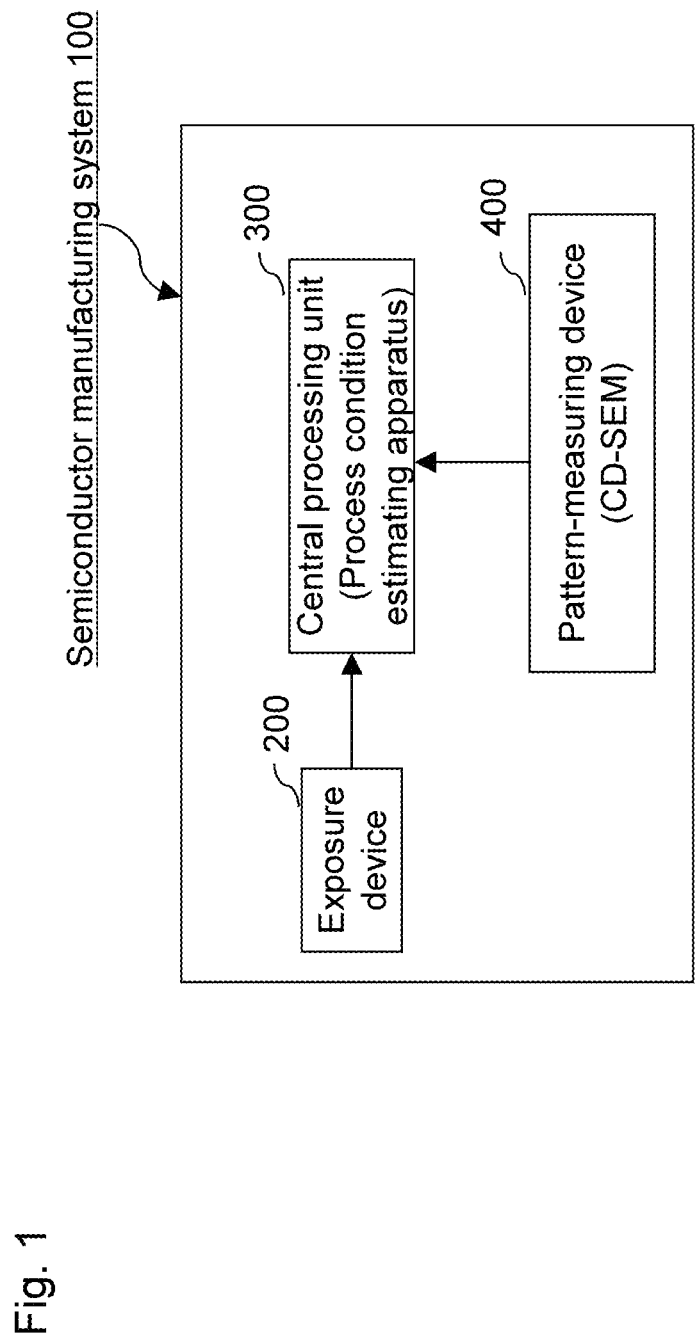
FIG. 1 is a block diagram of a semiconductor manufacturing system including a process condition estimating apparatus in accordance with one or more embodiments.

One or more embodiments of the invention are described with reference to the drawings. The same reference numerals are given to common parts in each figure, and duplicate description is omitted.

A. Overview of Embodiments

FIG. 1 is a block diagram of a semiconductor manufacturing system including a process condition estimating apparatus in accordance with one or more embodiments. The semiconductor manufacturing system 100 includes an exposure device 200, a central processing unit 300, and a pattern-measuring device 400. Each of the devices (200, 300, and 400) are connected to a wired or wireless communication network. The unit 300 corresponds to the process condition estimating apparatus. The system 100 is an example in which the process condition estimating apparatus is used. The process condition estimating apparatus may be used in a mask manufacturing system, a Flat Panel Display (FPD) manufacturing system, a printed circuit board manufacturing system, and other fine processing systems.

The device 200 exposes patterns formed on a mask to a resist applied to a semiconductor wafer. The device 200 corresponds to a processing device which processes an object in accordance with the embodiments.

The device 400 is a scanning electron microscope (CD-SEM; Critical Dimension-Scanning Electron Microscope). The device 400 acquires information of a three-dimensional shape of a resist pattern formed on the wafer using the device 200 which exposes the resist applied on the wafer via the mask. The device 400 corresponds to a measuring device, which measures measurement data in accordance with the embodiments. Objects to be measured are not limited to resist patterns, but may be patterns after etching. The embodiments are not limited to semiconductor manufacturing, but may be any processing performed on an object, such as mask manufacturing, FPD manufacturing, printed circuit board manufacturing.

The embodiment utilizes a SEM image of the object as the measurement data. The measurement data is not limited to the image of the object, but may be any data, such as data measured on the object, such as a line width of a linear pattern, a hole diameter of a contact hole, an optical image, and a reflection spectrum.

The central processing unit (hereinafter referred to as a process condition estimating apparatus) 300 is an apparatus for estimating a process condition in which an object is processed. The apparatus 300 includes an input unit, a feature amount calculation unit, and an estimation unit, as functional blocks. The input unit inputs measurement data acquired at a predetermined position of the object. The feature amount calculation unit calculates feature amounts from the measurement data. The estimation unit estimates a process condition in which the object is processed from the measurement data and/or the feature amount, based on a process-condition-estimating function for inputting the measurement data and/or the feature amount and outputting an estimation value of the process condition. Although the functions of the feature amount calculation unit and the estimation unit are described separately, the functions need not be clearly separated. The functions may be implemented as another estimation unit.

When the functions are implemented on the other estimation unit, the other estimation unit estimates the process condition in which the object is processed from the measurement data, based on a process-condition-estimating function for inputting the measurement data and outputting an estimation value of the process condition. The apparatus 300 may include a display which displays the estimated process condition.

The apparatus 300 is a functional block, and it is not limited to be implemented by hardware, but may be implemented on the computer as software, and the form of the implementation is not limited. For example, the functional block may be implemented as software installed on a dedicated server connected to a user device (personal computer, etc.) via a wired or wireless communication link (internet connection, etc.), or may be implemented using a so-called cloud service.

B. Method for Estimating Process Condition

Figure 2:
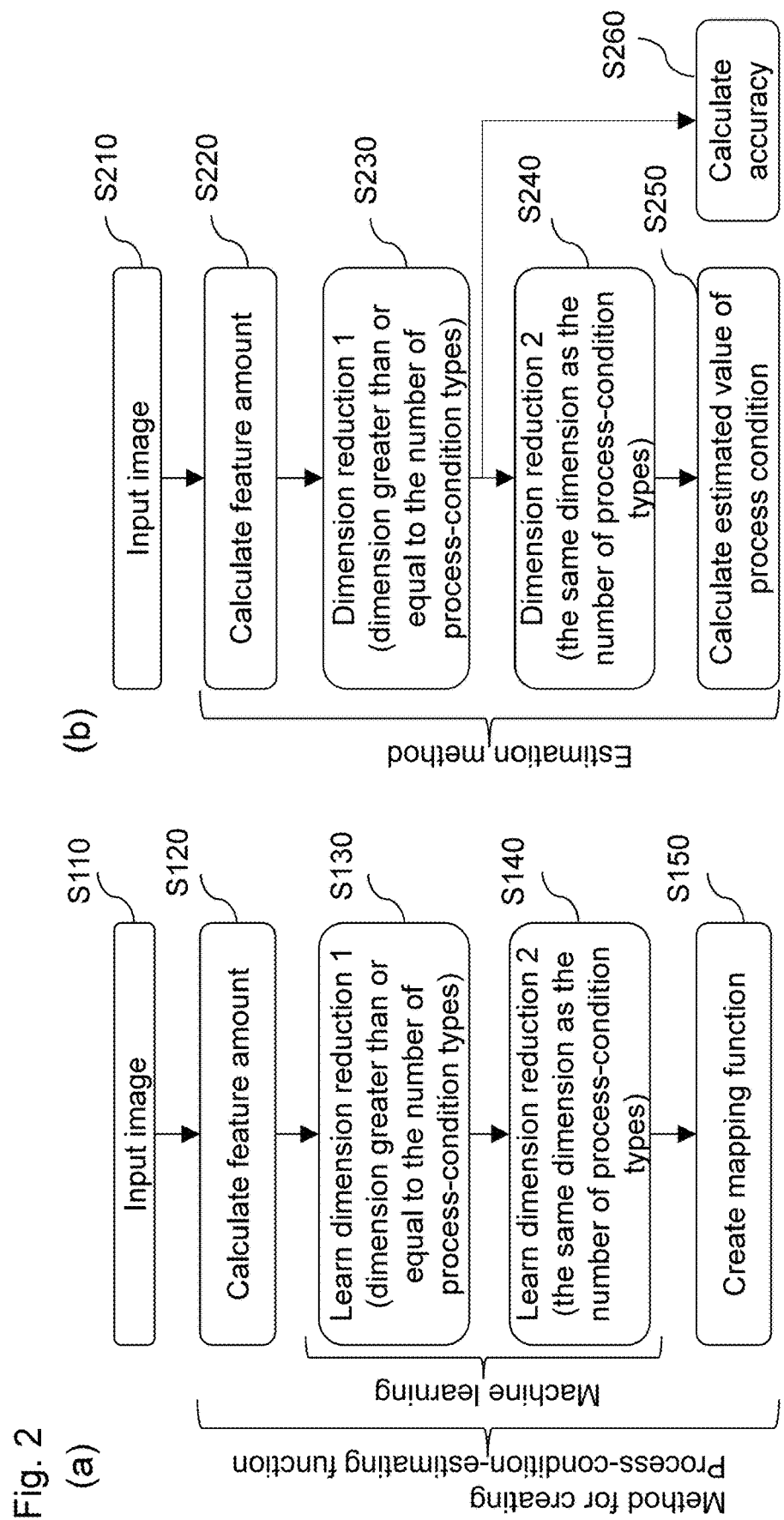
FIG. 2 are flowcharts of (a) a method for creating process-condition-estimating function and (b) a method for estimating process condition in accordance with the embodiments.

FIG. 2 are flowcharts of (a) a method for creating process-condition-estimating function and (b) a method for estimating process condition in accordance with the embodiments.
(b1. Description of Flowchart of Method for Creating Process-Condition-Estimating Function)

FIG. 2 (*a*) is the flowchart of the method for creating process-condition-estimating function. The process-condition-estimating function is a function for estimating a process condition in which the object is processed from the measurement data of the object acquired by the measuring device. The input of the function is the measurement data and the output of the function is the estimation value of the process condition. The apparatus 300 estimates a process condition (focus position and exposure amount) under which the device 200 processes the object from the images measured by the device 400. The focus position is hereinafter referred to as focus. The exposure amount is hereinafter referred to as dose.

S110 is a step of inputting images which are acquired at a predetermined position of the object. The object is processed in advance under different process conditions.

Figure 3:
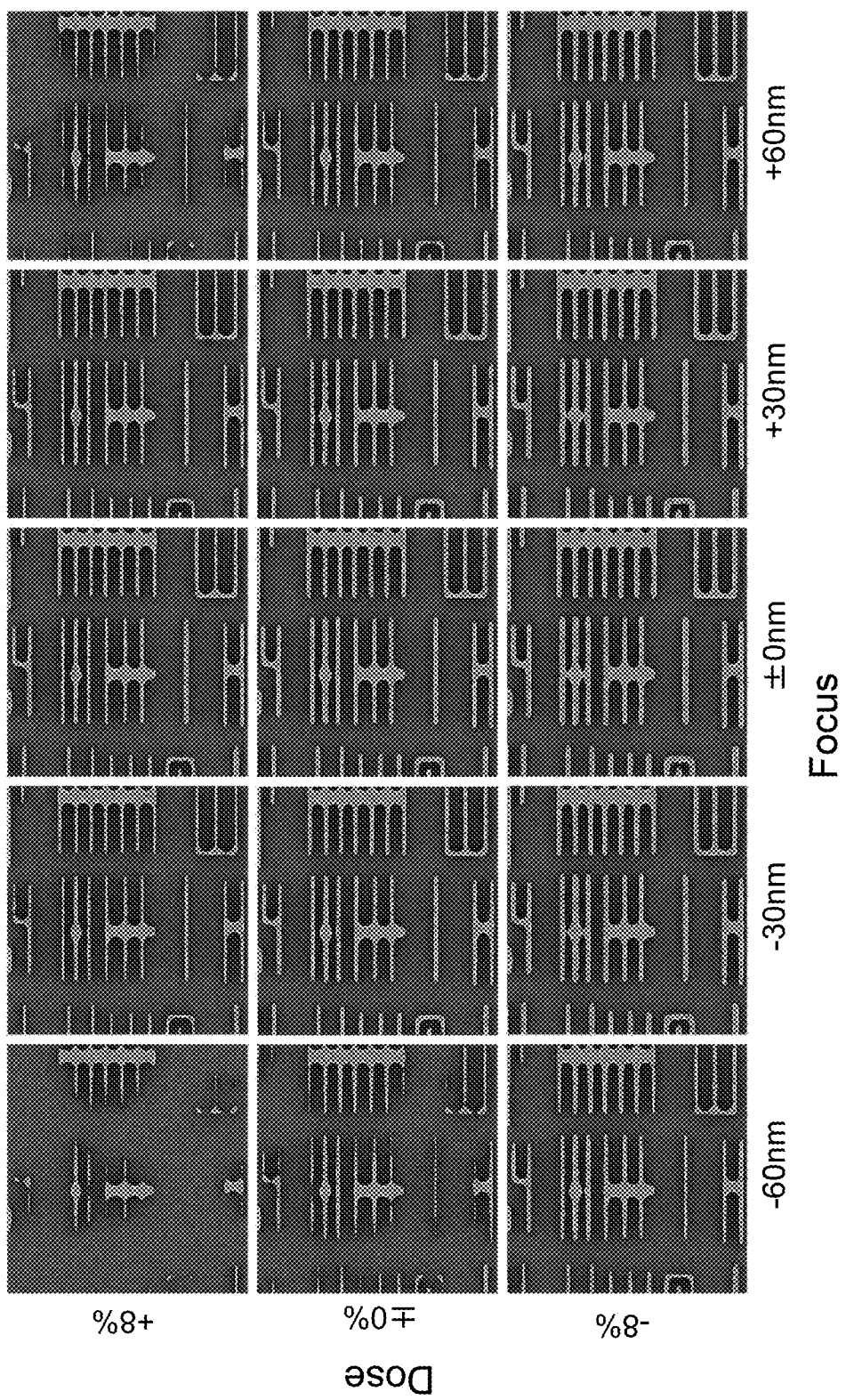
FIG. 3 shows an example of input images in accordance with the embodiments.

FIG. 3 shows an example of input images in accordance with the embodiments. The horizontal axis on FIG. 3 represents the focus of the exposure device 200, and the vertical axis on FIG. 3 represents the dose of the exposure device 200. A plurality of images measured in advance at the ratio shown in FIG. 3 are displayed. The number of process-condition types means the number of types of process condition such as focus and dose. The number of the process-condition types in FIG. 3 are two (focus and dose). When conditions of the dose are set to three (−8%, ±0%, +8%) and conditions of the focus are set to 5 (−60 nm, −30 nm, ±0 nm, +30 nm, +60 nm), the total number of process-condition types is 15. The images may include various kinds of patterns and/or patterns sensitive to process conditions. The image relating to one process condition is not limited to one image, but may be a plurality of images acquired at a plurality of positions of the object.

Process conditions are not limited to focus and dose, but may be thickness and/or etching conditions relating to the object and/or a thin film formed on the object. When process conditions are conditions which are not changed in the wafer, such as the thickness of the thin film formed on the object, etching process time, etching gas flow rate, and etching RF power, a plurality of wafers may be processed under different process conditions and each of images relating to each of the process conditions may be acquired from each of the wafers.

S120 is a step of calculating feature amounts of the input images.

Figure 4:
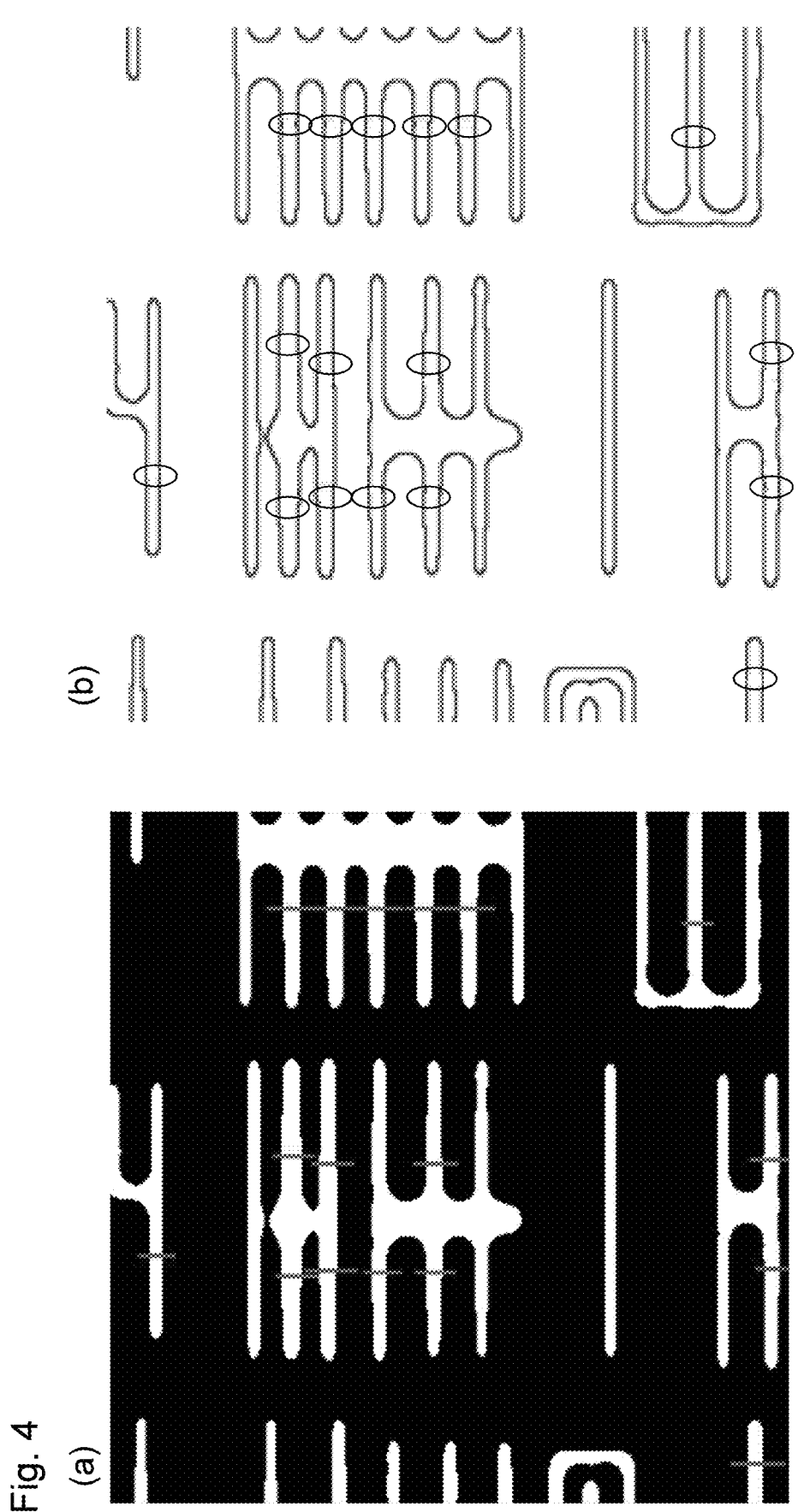
FIG. 4 is an example of calculating feature amounts in accordance with the embodiments.

FIG. 4 is an example of calculating feature amounts in accordance with the embodiments. The line widths of the solid lines marked on the actual pattern image shown in FIG. 4 (*a*) are measured as the feature amounts. There are 17 solid lines. Each line width of the 17 solid lines is calculated as feature amounts. FIG. 4 (*b*) shows just the frame lines of the pattern image in order to clearly display the line widths to be measured. Each of the line widths to be measured is covered with an elliptical shape. Feature amounts are not limited to the line widths, but may be edge positions, edge inclinations, curvatures, and/or areas of patterns. Feature amounts may be each pixel value (including all pixel values) of the input image in S110 and/or values calculated from each of pixel values. For example, when pixel values of a specific portion of the input image are feature amounts, the input unit sets the specific portion of the input image data (such as, a region where pattern region and/or pattern edge is changed). When the size of the specific portion is a rectangular region where is W pixels in width and H pixels in height, the input unit outputs W×H pixel values as measurement data. This means that the number of input dimensions of the first dimension reduction to be performed later is W×H dimensions. When the size of the specific portion is not a rectangle, the pixel values of each of the pixels included in the specific portion may be output as measurement data. In this case, the specific portion may be set to include a region that changes depending on the process conditions. Instead of using the pixels of the entire input image data, limiting the input image data to the pixels of the specific portion, is able to reduce calculation-processing amounts in the feature amount calculation unit and the estimation unit.

S130 is a step of learning the first dimension reduction method. The first projection function for performing the first dimension reduction is learned and generated. The first dimension reduction reduces from 17 dimensions (the number of dimensions of the feature amounts calculated in S120) to 3 dimensions (the number of dimensions between 17 dimensions and 2 dimensions). The 2 dimensions means the number of process-condition types (in the embodiment, focus and dose). The first dimension reduction is not limited to reducing to 3 dimensions, which is the dimension that adds 1 (one) to the number of process-condition types, but may be any number that is between the number of dimensions of the feature amounts and the number of process-condition types. The dimension reduction in the embodiment is a manifold learning method, such as a Locally Linear Embedding method (LLE method). The process-condition types are process conditions which are estimated by the apparatus 300.

Figure 5:
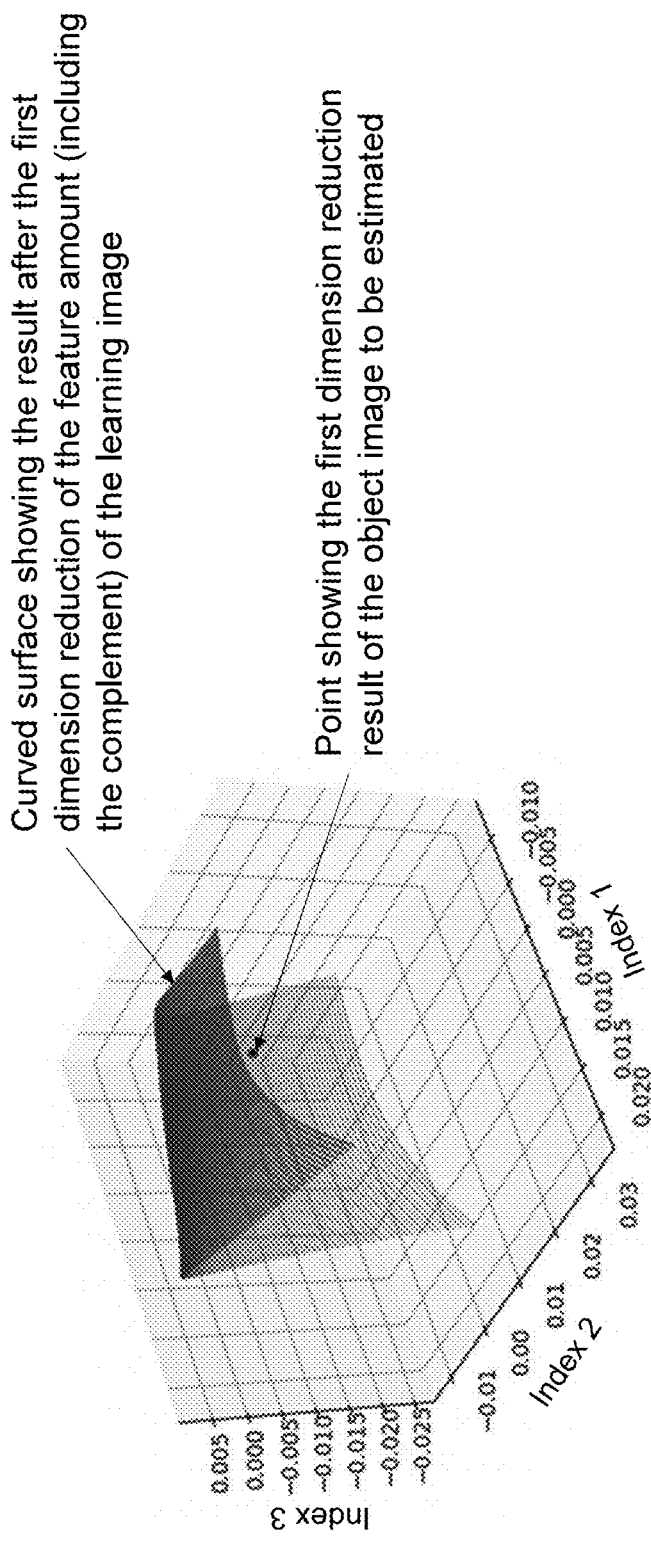
FIG. 5 shows the first dimension reduction method.

FIG. 5 shows the first dimension reduction method. FIG. 5 shows the results of the first dimension reduction on the three-dimensional coordinates. FIG. 5 means that 17 dimensional learning data is projected onto a three-dimensional curved surface. Each axis in FIG. 5 has no physical meaning, because of the first projection function for reducing from 17 dimensions to 3 dimensions. When the result of the first dimension reduction is not sufficient (that is to say, when the space between the process conditions is not sufficient after the first dimension reduction), adding one or more measurement points to the object, increasing or decreasing of one or more feature amounts, or changing conditions and/or methods of the first dimension reduction may be performed. The measurement points of the object may increase the number of the points by complementing the feature amounts.

An evaluation value for evaluating the result of the first dimension reduction may be output. For example, the space between the processing conditions after the first dimension reduction may be corrected by the space between the processing conditions before the first dimension reduction, and the minimum value of the corrected space may be output as the evaluation value of the first dimension reduction.

S140 is a step of learning the second dimension reduction method. The second projection function for performing the second dimension reduction is learned and generated. The second dimension reduction reduces from 3 dimensions (the results of performing the first dimension reduction in S130) to 2 dimensions (the number of the process-condition types in the embodiment). The dimension reduction in the embodiment is a manifold learning method, such as a Locally Linear Embedding method (LLE method). When the result of the second dimension reduction is not sufficient (that is to say, when the space between the process conditions is not sufficient after the second dimension reduction), adding one or more measurement points to the object, increasing or decreasing of one or more feature amounts, or changing conditions and/or methods of the second dimension reduction may be performed. The measurement points of the object may increase the number of the points by complementing the feature amounts.

Figure 6:
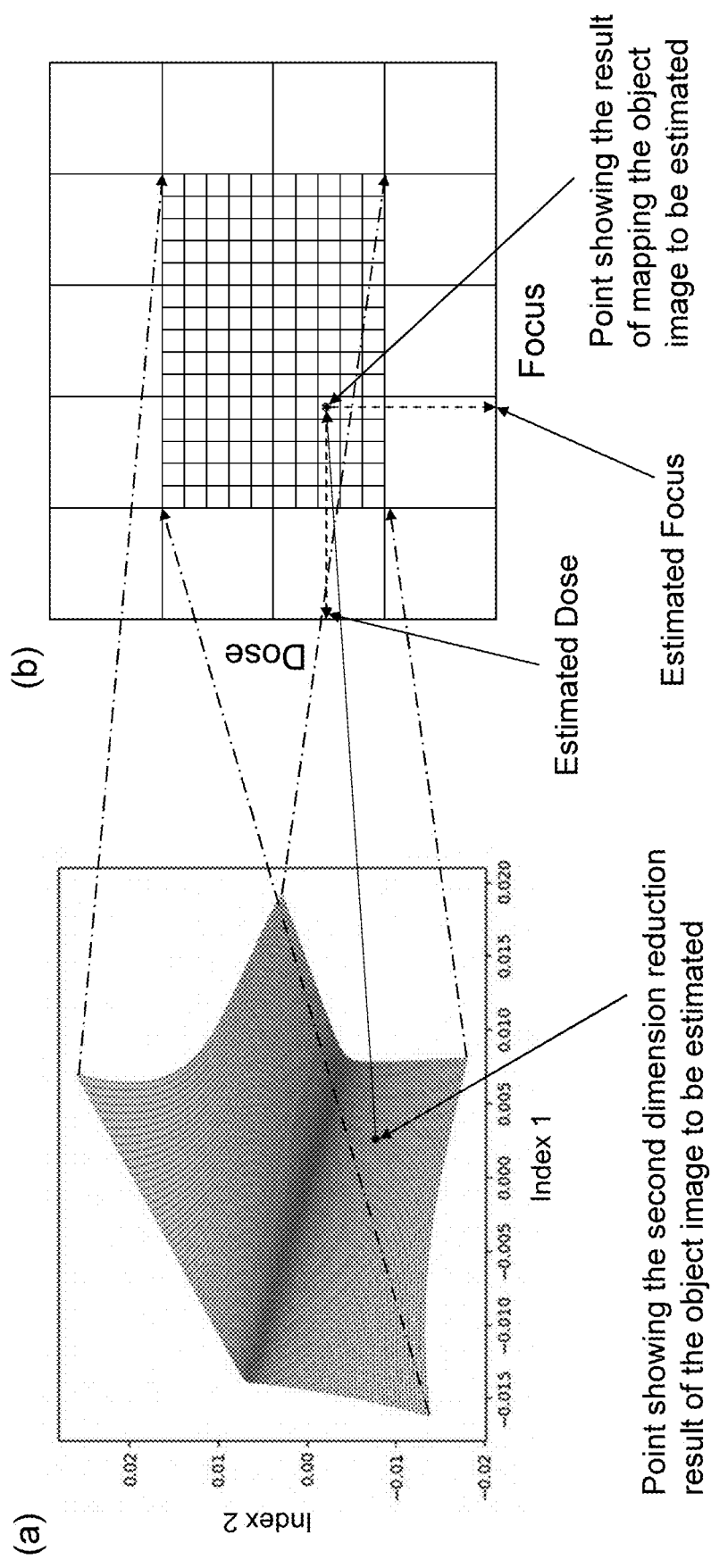
FIG. 6 shows the second dimension reduction method.

FIG. 6 shows the second dimension reduction method. FIG. 6 (a) shows the results of the second dimension reduction on the two-dimensional coordinates. Each axis in FIG. 6 has no physical meaning, because of the second projection function for reducing from 3 dimensions to 2 dimensions.

S150 is a step of calculating the mapping function. FIG. 6 (b) shows a function that maps the measurement data of the object processed under different process conditions projected on the two-dimensional coordinates after the second dimension reduction, onto the two-dimensional coordinates of the processed focus and dose.

The mapping function maps the result of performing the dimension reduction to the same dimension as the number of process-condition types onto values of the actual process conditions. For example, a function for converting the two-dimensional coordinate value acquired in step S140 to the processed focus and dose is calculated. The converting function is able to calculate the estimated focus and dose from values after converting.

The learning steps (S130 and S140) and the step of calculating the mapping function (S150) are not limited to the above-mentioned dimension reduction method and mapping method, but may be created by other machine learning methods, to create a function for estimating process conditions, or may be created by a neural network including a deep neural network.

When there is a processing condition in which a part of feature amounts cannot be calculated (for example, when there is a pattern defect, a pattern collapse, a pattern bridging or adjacent patterns are combined), a plurality of process-condition-estimating function may be created, such as, creating a process-condition-estimating function in a process condition range in which all feature amounts can be calculated, or creating a process-condition-estimating function in all process condition ranges except for feature amounts that cannot be calculated. This is because when some process conditions deviate largely, the process condition estimation is performed with small feature amounts, and when some process conditions are close to the center condition, more accurate process condition estimation is performed with a lot of feature amounts. The combination of the feature amounts and the process-condition-estimating function may be a plurality of combinations.

(b2. Description of Flowchart of Method for Estimating Process Condition)

FIG. 2 (b) is the flowchart of the method for estimating processing condition.

S210 is a step similar to S110, that the input unit in the apparatus 300 inputs an image of an object of which a user of the apparatus 300 wishes to actually estimate the process condition. The image input in S210 is an image acquired at a predetermined position of the object using the same method as the image input in S110. The predetermined position of the object is not limited to the same coordinates in the object, but includes a position which is located in a similar structure of the object. For example, when the object has patterns, the predetermined position of the object is the position of the same pattern, and when the object does not have patterns, the predetermined position of the object is the position of the same film configuration.

S220 is a step in which the feature amount calculation unit in the apparatus 300 calculates feature amounts of the input image. In the embodiment, S220 calculates 17 feature amounts in the same way as S120.

The estimation unit in the apparatus 300 performs the dimension reductions in S230 and S240. In S230, the estimation unit performs the first dimension reduction from 17 dimensions (the feature amounts calculated in S220) to 3 dimensions (the number of dimensions between 17 dimensions and 2 dimensions) in the same way as S130, using the first projection function learned in S130. The result of the first dimension reduction is set at one point on the three-dimensional coordinates in FIG. 5.

In S240, the estimation unit performs the second dimension reduction from the result of the first dimension reduction in S230 to two dimensions (the number of the process-condition types in the embodiment), using the second projection function learned in S140. The result of the second dimension reduction is set at one point on the two-dimensional coordinates in FIG. 6 (a).

In S250, the estimation unit in the apparatus 300 maps the result of the second dimension reduction onto the two-dimensional coordinates of focus and dose, using the mapping function calculated in S150. The mapping result is set at one point on the two-dimensional coordinates in FIG. 6 (b). The embodiment is able to calculate the estimated values of the process conditions (focus and dose).

When there is a combination of a plurality of feature amounts and process-condition-estimating functions, each result may be integrated to calculate estimated values of process conditions.

The embodiment calculates an accuracy of the estimated values of the process conditions between S230 (the first dimension reduction method) and S240 (the second dimension reduction method). The accuracy is a value for evaluating reliability of the estimated process conditions. For example, if the data estimating the process conditions is much different from the learning data, it is indicated that there is a possibility that the error of the estimated process conditions is large. Since S230 (the first dimension reduction method) sets the number of dimensions of the intermediate between the number of dimensions of the feature amounts and the number of dimensions of the process-condition types, it is able to calculate the accuracy of the estimated values of the process conditions. For example, after step S230 (the first dimension reduction method), the distance between the point that is three-dimensionally reduced as shown in FIG. 5 and the curved surface acquired from the learning image is output as the accuracy of the estimated value. In this case, the closer to 0 the accuracy (for example, error rate) is, the higher the accuracy is (that is, the reliability becomes higher).

(b3. Method 1 for Calculating Accuracy: Case of Performing Dimension Reductions in Two Stages)

A method for calculating accuracy (S260) in case of performing dimension reductions in two stages (S230, S240) shown in FIG. 2(b) is described. The result of the first dimension reduction (S230) acquired from the i-th learning image is set to $P_{i,j}$. Here, j represents a dimension after the first dimension reduction. The result of the first dimension reduction acquired from the object to be estimated is set to $S_j$.

The accuracy A is defined as the equation (1).

[Equation 1]

$$A = \min_i \sqrt{\sum_j \left(\frac{P_{i,j} - S_j}{\sigma_j}\right)^2} \quad (1)$$

where $\sigma_j$ is a correction factor (constant). When this method is performed with high accuracy, the feature amounts acquired from the learning image may be complemented to increase the number of process conditions.

(b4. Method 2 for Calculating Accuracy: Case of Performing Dimension Reduction in One Stage)

The dimension reduction does not need to be performed in two stages, but may be performed in one stage. If there is not an intermediate result of the dimension reduction, such as the dimension reductions in two stages, the accuracy A may be calculated after estimating the processing conditions. The j-th feature amount calculated from the object to be estimated is set to $S_j$. The j-th feature amount of the learning image closest to the estimated process condition is set to $P_j$.

The accuracy A is defined as the equation (2).

[Equation 2]

$$A = \sqrt{\sum_j \left(\frac{P_j - S_j}{\sigma_j}\right)^2} \quad (2)$$

where $\sigma_j$ is a correction factor (constant). The feature amount of the learning image closest to the estimated process condition may be the feature amount determined with high accuracy by complementing.

In the embodiment, a pattern-shaped image is used as the measurement data of the object, but other data except for the image may be used as the measurement data. For example, the reflected light spectrum of the object may be used as the measurement data, and the process conditions (processing time, gas flow rate, temperature, pressure, etc.) of a thin film formed on the object may be estimated.

C. Effect

As described above, the embodiments are able to estimate a process condition without limiting forms (such as shapes) of the object.

D. Another Method for Estimating Process Condition

Figure 7:
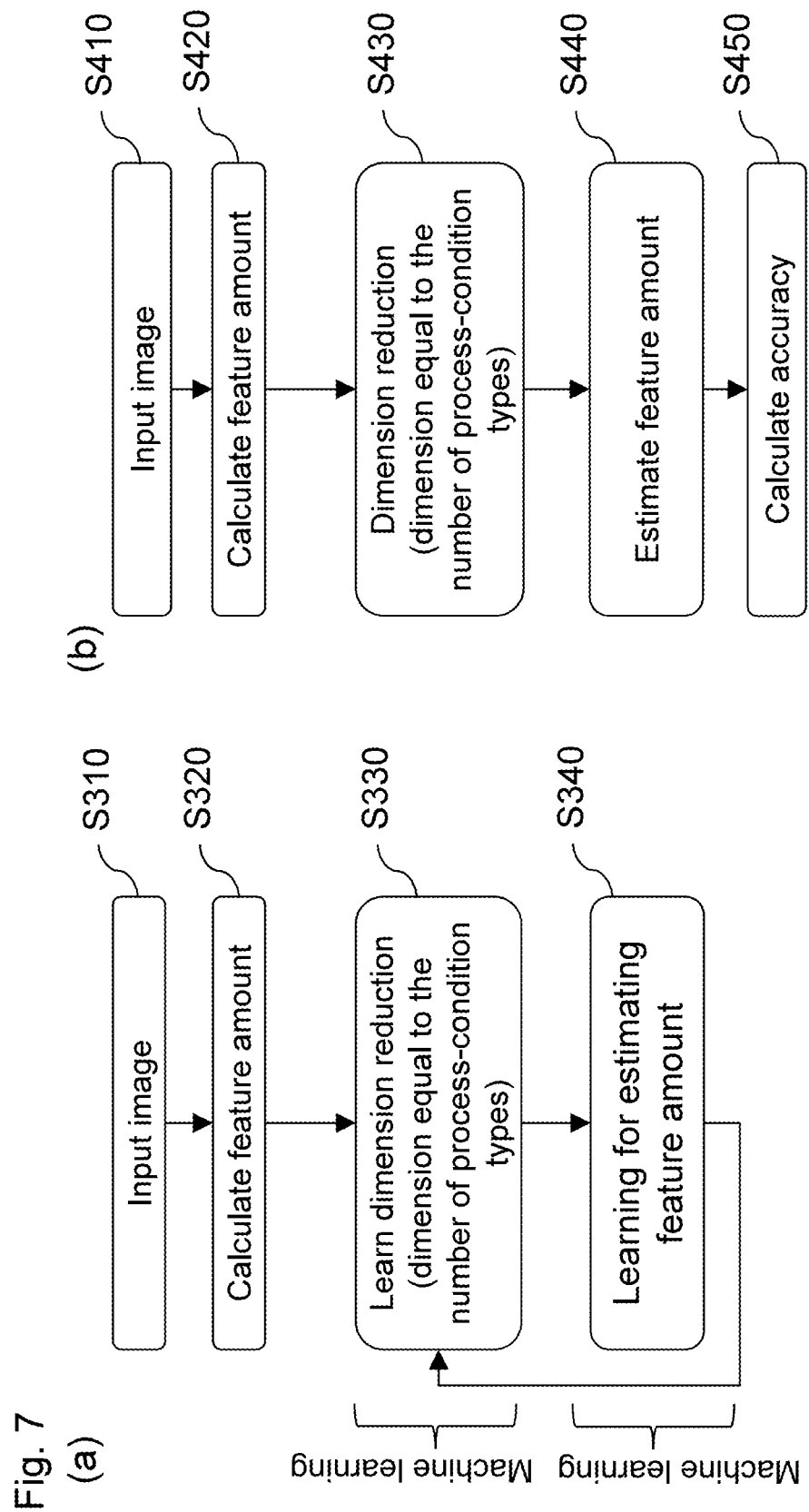
FIG. 7 are flowcharts of (a) a method for creating process-condition-estimating function and (b) a method for estimating process condition in accordance with other embodiments.

Another method for estimating process condition is described. FIG. 7 are flowcharts of (a) the other method for creating process-condition-estimating function and (b) the other method for estimating process condition in accordance with other embodiments.

(d1. Description of Another Flowchart of Method for Creating Process-Condition-Estimating Function)

FIG. 7 (a) is the flowchart of the method for creating process-condition-estimating function using a neural network. For example, a process-condition-estimating function is described in FIG. 2, and duplicate description is omitted.

S310 is a step similar to S110 shown in FIG. 2, that inputs images which are acquired at a predetermined position of the object. The object is processed in advance under different process conditions. S310 uses an example of input images shown in FIG. 3.

S320 is a step of calculating feature amounts of the input images. S320 uses an example of calculating the feature amounts shown in FIG. 4.

S330 is a step of learning the method of performing the dimension reduction of the feature amounts. The projection function for performing the dimension reduction is learned and generated. The dimension reduction reduces from 17 dimensions (the number of the solid lines shown in FIG. 4) to 2 dimensions (the number of the process-condition types shown in FIG. 3). A neural network is utilized for the dimension reduction in this embodiment. The process-condition types are process conditions which are estimated by the apparatus 300.

Figure 8:
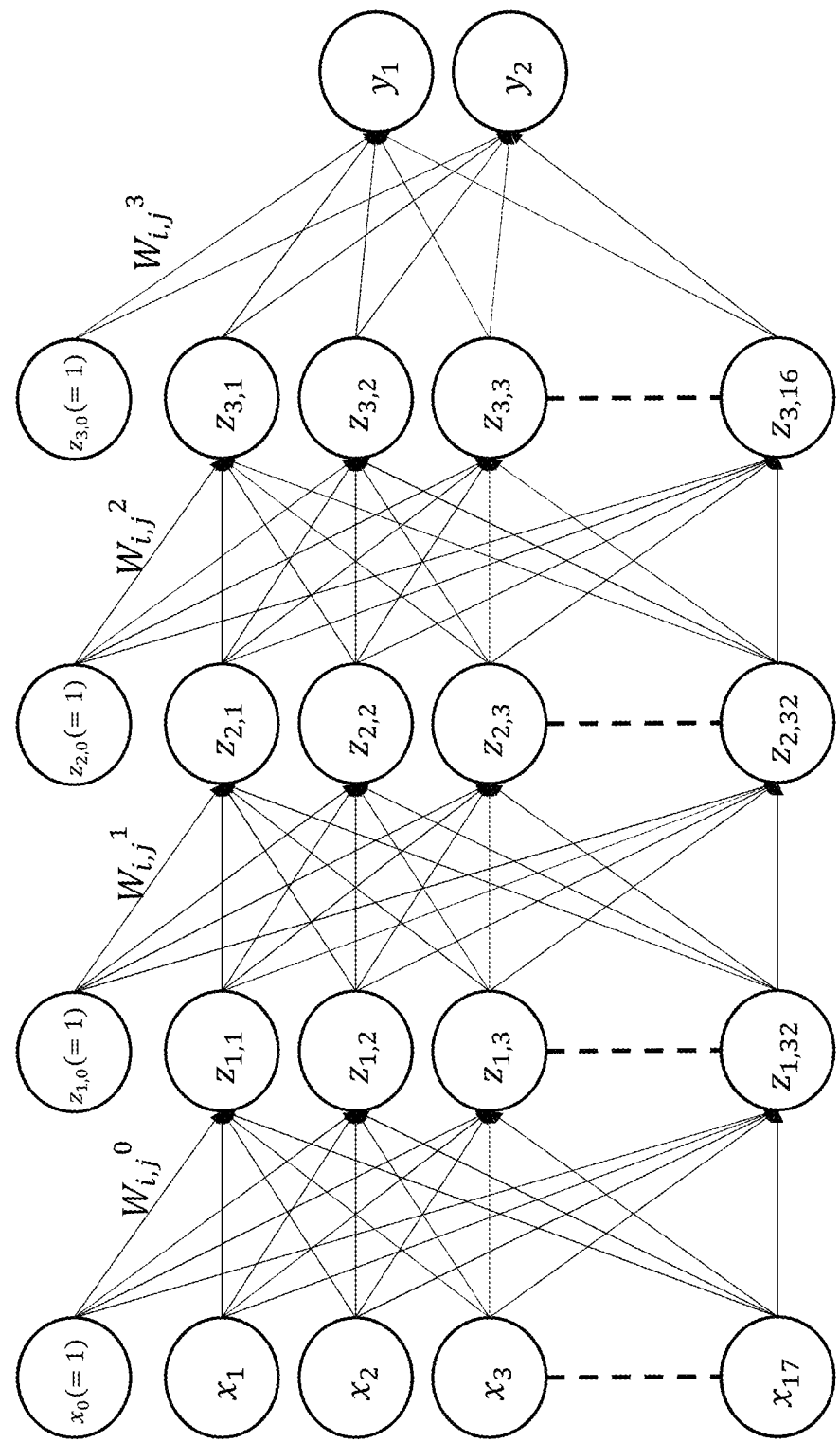
FIG. 8 shows an example of a neural network for performing dimension reduction in accordance with the other embodiments.

FIG. 8 shows an example of a neural network for performing dimension reduction in accordance with this embodiment. The neural network has three hidden layers. Each of the first and the second hidden layers has 32 nodes and the third hidden layer has 16 nodes.

In FIG. 8, $x_i$ are feature amounts calculated in S320 and $y_i$ are the estimated values of the process conditions, with each of $x_0$ and $z_{k,0}$ being a constant. The value of the constant is 1 (one). FIG. 8 shows an example of process-condition-estimating function for inputting 17 pieces of measurement data (17 pieces of feature amounts of the image) and outputting estimated values of 2 pieces of process conditions (focus and dose). The example is created by a neural network.

The nodes of each of the layers are calculated by the equations 3 through 5.

[Equation 3]
$$z_{1,j} = f_{1,j}\left(\sum W_{i,j}^0 x_i\right) \quad (3)$$

[Equation 4]
$$z_{k,j} = f_{k,j}\left(\sum W_{i,j}^{k-1} z_{k-1,i}\right) \quad (4)$$

[Equation 5]
$$y_k = f_k\left(\sum W_{i,k}^3 z_{3,i}\right) \quad (5)$$

where $W_{i,j}^k$ is a real number, i is an input number, j is the node number of each layer, k is the number of the hidden layers, and $f_{i,j}$ is an activation function, such as a sigmoid function and a hyperbolic tangent function. The learning is to optimize the value of $W_{i,j}^k$ so that the process conditions are output when the feature amounts are input. The optimization may utilize a gradient descent method, a quasi-Newton method, a momentary method, an Adam method, an LBFGS (Limited-Memory BFGS) method, and SGD (Stochastic Gradient Descent) method. The feature amounts to be input may be normalized to be within a predetermined range as pre-processing before being input. When the process conditions to be output are normalized, returning to the original process conditions may be performed as the post-processing.

In this embodiment, the feature amounts calculated by the feature amount calculation unit is input to the estimation unit. When the measurement data (here, the image data) is directly input to the estimation unit instead of the feature amounts calculated by the feature amount calculation unit, the process-condition-estimating function may be created by a CNN (Convolutional Neural Network). In order to reduce the calculation-processing amounts, just a region where a pattern region or a pattern edge is changed may be used as the specific portion of the input image data.

S340 is a step of learning feature-amount-estimating function for calculating the feature amounts to be input in S330 from the process conditions. A case where the feature amounts are estimated using a neural network in the same manner as S330 is described.

Figure 9:
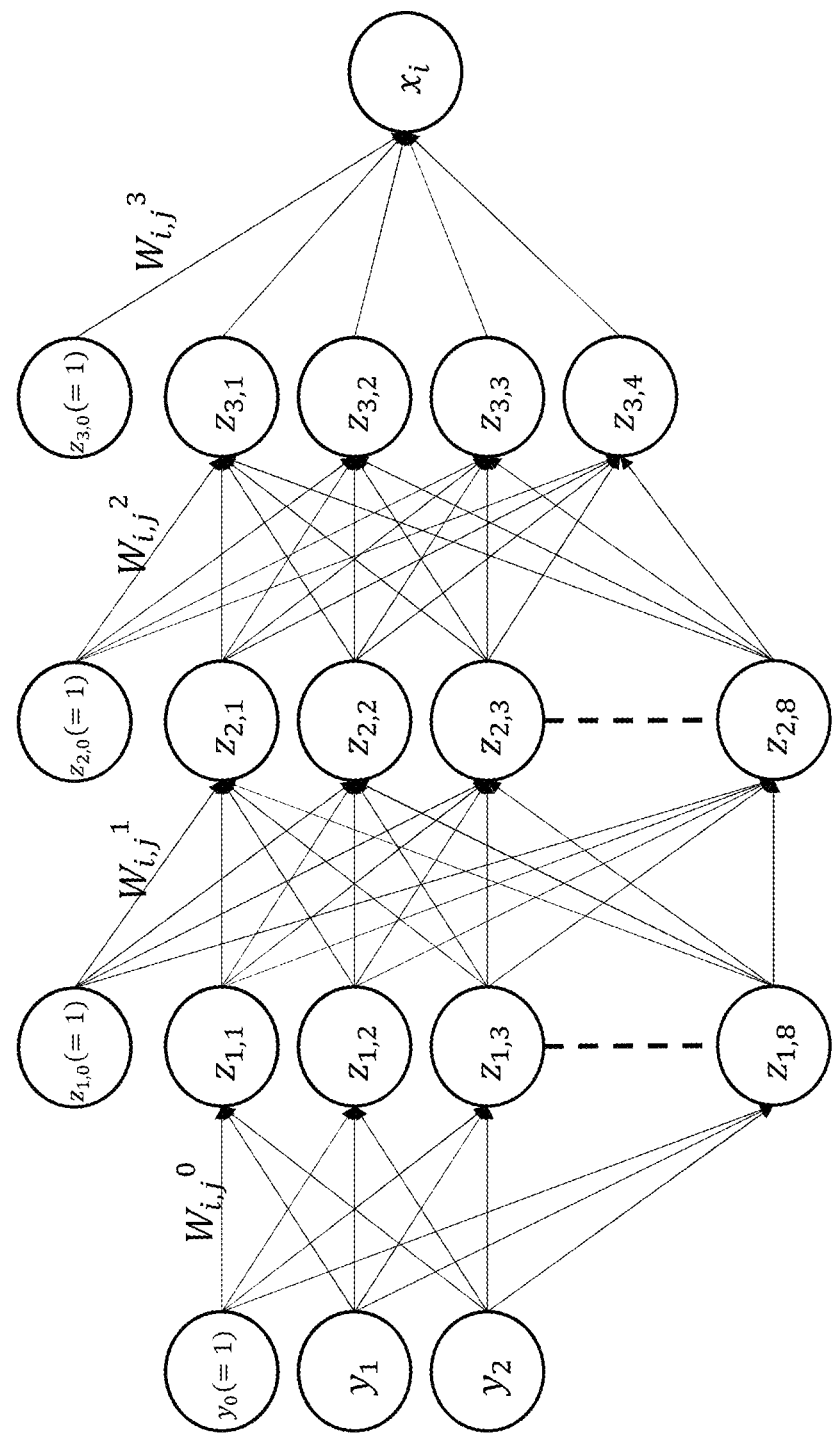
FIG. 9 shows an example of a neural network for estimating feature amounts in accordance with the other embodiments.

FIG. 9 shows an example of a neural network for estimating feature amounts in accordance with this embodiment. The neural network has three hidden layers. Each of the first and the second hidden layers has 8 nodes and the third hidden layer has 4 nodes. In FIG. 9, $y_i$ are the process conditions and $x_i$ are the estimated values of the feature amounts. The number of the feature amounts is 17 and the number of the process conditions is 2 (focus and dose). Therefore, the number of the neural networks shown in FIG. 9 is 17. Each parameter is the same as in S330 and the learning method is performed the same as in S330. In this embodiment, the feature-amount-estimating function is created by a neural network. Other interpolation methods such as a Bi-Linear method and a Bi-Cubic method may be used instead of a neural network. S340 may be omitted when calculating accuracy and/or evaluating the learning result are not performed.

The accuracy of the process-condition-estimating function learned in S330 and the feature-amount-estimating function learned in S340 may be improved by repeatedly re-learning S330 using the feature amounts estimated in S340.

Figure 11:
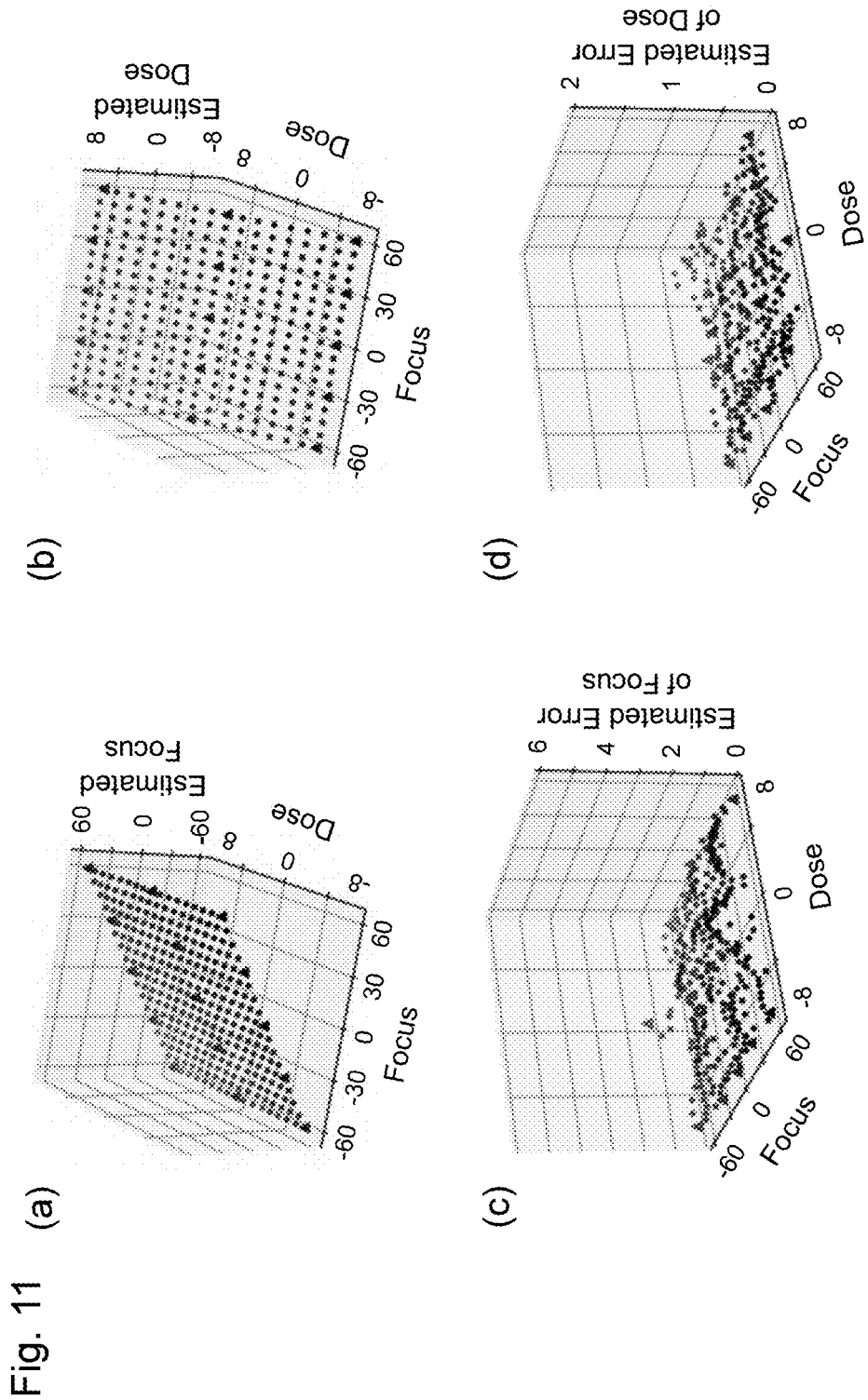
FIG. 11 are graphs showing amounts or errors estimated by the focus and the dose (Case 2: with re-learning).

FIG. 10 and FIG. 11 are graphs showing amounts or errors estimated by the focus and the dose. FIG. 10 shows a case without re-learning, and FIG. 11 shows another case with re-learning.

As the coordinate axes of each graph are shown in FIG. 10 (a), the X-axis is focus, the Y-axis is dose, and the Z-axis is estimated value or error. FIG. 10 (a) is drawn by plotting the focuses on the X-axis, the doses on the Y-axis, and the estimated focuses on the Z-axis. FIG. 10 (b) is drawn by plotting the focuses on the X-axis, the doses on the Y-axis, and the estimated doses on the Z-axis. FIG. 10 (c) is drawn by plotting the focuses on the X-axis, the doses on the Y-axis, and the estimated errors of the focuses on the Z-axis. The estimated error of the focus is an absolute value of the difference between the focus and the estimated focus. FIG. 10 (d) is drawn by plotting the focuses on the X-axis, the doses on the Y-axis, and the estimated errors of the doses on the Z-axis. The estimated error of the dose is an absolute value of the difference between the dose and the estimated dose.

In each graph of FIG. 10, the triangle marks indicate the estimated focuses and doses estimated by the neural network which is learned in S330 from the feature amounts extracted from the images used for learning. The black circle marks indicate the estimated focuses and doses which the neural network learned in S330 estimates from the feature amounts which the neural network learned in S340 estimates from doses and focuses. FIGS. 10 (c) and (d) show that the estimated errors of focuses and errors (the triangle marks) estimated from the feature amounts used for learning is small, and that the estimated errors of focuses and errors (the black circle marks), which the neural network learned in S330 estimates from the feature amounts which the neural network learned in S340 estimates from the doses and focuses, is large. FIGS. 10 (c) and (d) are plotted separately for each of the estimated process conditions. The way of plotting is not limited to this, and each error may be multiplied by a correction coefficient, and the sum of the multiplied errors may be taken into one plot.

FIG. 10 shows that the accuracy of the estimation is high for the dose and focus used for learning in S330, but that the accuracy of the estimation is low for the other doses and focuses. The learning result performed in S330 can be evaluated by obtaining the result for estimating the process conditions except for the result estimated from the image used for learning. Evaluating the learning results is ideally performed using images acquired at the predetermined position of samples of objects. The samples are processed in advance under different process conditions. For this reason, it is necessary to prepare and measure a lot of the samples.

In particular, in semiconductor manufacturing, processing a lot of samples of the objects under different process conditions involves a significant cost and it is very difficult to acquire the sample images at predetermined positions of the objects. Therefore, it is effective to evaluate the learning results of estimating the process conditions using the estimated feature amounts.

When the estimated error in evaluating the learning results of estimating the process conditions is large, the feature amounts estimated from the doses and the focuses in S340 may be added to the learning performed in S330 and the re-learning in S330 may be performed. FIG. 11 (a) through (d) are the estimated results of the re-learned neural network. Similar to FIG. 10 (a) through (d), the X-axis is a focus, the Y-axis is a dose, and each of the Z-axes are an estimated focus, an estimated dose, an estimated error of focus, and an estimated error of dose. FIG. 11 shows that the estimated errors of focus and dose (the black circle marks) which are estimated from the feature amounts estimated in S340 is smaller than FIG. 10 (before the re-learning), and that the accuracy of the estimation is improved. S330 re-learned by the feature amounts estimated in S340 improves the accuracy of the estimation.

When the estimated error is large, the configuration of the neural network may be changed, the type of the feature amount and the extracted pattern may be changed, images under different process conditions may be added to the learning image, or images at different positions of the same process conditions may be added.

The neural networks used in S330 and S340 are not limited to the above-mentioned neural networks, and the number of the layers and/or the nodes, or the activation function may be changed.

(d2. Description of Another Flowchart of Method for Estimating Process Condition)

FIG. 7 (b) is the flowchart of the method for estimating processing condition.

S410 is a step similar to S310, that the input unit in the apparatus 300 inputs an image of an object of which a user of the apparatus 300 wishes to actually estimate the process condition. The image input in S410 is an image acquired at a predetermined position of the object using the same method as the image input in S310. The predetermined position of the object is not limited to the same coordinates in the object, but includes a position which is located in a similar structure of the object. For example, when there is a pattern in the object, the predetermined position includes the position of the same pattern shape. When there is not a pattern in the object, the predetermined position includes the position of the same film configuration.

S420 is a step in which the feature amount calculation unit in the apparatus 300 calculates feature amounts of the input image. In the embodiment, S420 calculates 17 feature amounts in the same way as in S320.

The estimation unit in the apparatus 300 performs the dimension reduction of S430. In S430, the estimation unit performs the dimension reduction from 17 dimensions (the feature amounts calculated in S420) to 2 dimensions (the number of process-condition types in the same way as S330), using the neural network learned in S330 (the learned neural network). The embodiment is able to calculate the estimated values of the process conditions (focus and dose).

When the normalized value of the process condition is used as the output value of the neural network, converting the normalized value to the value of the process condition may be performed as the post-processing. When there is a combination of a plurality of feature amounts and process-condition-estimating functions, each result may be integrated to calculate estimated values of process conditions.

S440 and S450 are able to calculate an accuracy of the estimated values of the processing conditions. The accuracy is a value for evaluating reliability of the estimated process conditions. For example, if the data estimating the process conditions is much different from the learning data, it is indicated that there is a possibility that the error of the estimated process conditions is large.

In S440, each feature amount is estimated by a neural network (learned neural network) which the estimated values of the processing conditions acquired in S430 is input to and is learned in S340. In S450, the square sum of the difference between each feature amount estimated in S440 and the feature amount acquired from the input image calculated in S420 is output as the accuracy. In this case, the closer to 0 the accuracy is, the higher the accuracy is.

(d3. Method for Calculating Accuracy: Case of Performing Dimension Reduction)

When the dimension reduction is performed by the neural network, the accuracy A defined by the equation (2) may be calculated after estimating the process conditions. The j-th feature amount calculated from the image acquired from the object to be estimated is set to $S_j$. The j-th feature amount estimated in S440 from the estimated process condition is set to $P_j$, where $\sigma_j$ is a correction factor (constant).

The embodiment utilizes a SEM image of the pattern shape as the measurement data. The measurement data is not limited to the SEM image, but others except for the SEM image may be utilized as the measurement data. For example, the reflected light spectrum of the object may be used as the measurement data, and the process conditions (processing time, gas flow rate, temperature, pressure, etc.) of a thin film formed on the object may be estimated. The accuracy is not limited to the above, but any method to calculate other accuracies may be utilized as long as the method can calculate a value for evaluating reliability of estimating the process condition.

(d4. Effect)

In this way, the other embodiments are also able to estimate a process condition without limiting forms (such as shapes) of the object.

The above-mentioned embodiments (including modified examples) of the invention have been described. Furthermore, two or more of the embodiments may be combined. Alternatively, one of the embodiments may be partially implemented.

Embodiments of the invention are not limited to the description of the above embodiments. Various modifications are also included in the embodiments of the invention as long as a person skilled in the art can easily conceive without departing from the description of the embodiments.

For example, the input unit may perform filter processing such as removing noise from an input image data. A plurality of objects may be processed under different process conditions, measurement data may be acquired from the same position of the objects, and feature amounts may be extracted from the measurement data. Machine learning is not limited to a neural network or a manifold learning method such as LLE method, but other machine learnings may be utilized.

The relationship between the extracted feature amount and the process condition may be analyzed to create a relationship rule. The process condition for performing the conditioning may be only one of the focus and the dose of the exposure processing. The process condition for performing the conditioning may be any one of processing time (such as etching and thin film growth), RF power, processing temperature, processing pressure, and gas flow rate, or a combination thereof. The feature amount may be any one of measurement data of the object and data extracted from the measurement data (such as pixel value, line width, space width, pattern pitch, curvature, edge position, inclination, edge width, pattern area, space area, and reflected light spectrum), or a combination thereof. The process condition estimating apparatus in accordance with the embodiments is not limited to a semiconductor wafer, but may be applied to a mask (such as a photomask and an Extreme Ultraviolet mask), an FPD, an interposer, a TSV (Through-Silicon Via), and a printed circuit board.

REFERENCE SIGN LIST

100 Semiconductor manufacturing system
200 Exposure device
300 Central processing unit (Process condition estimating apparatus)
400 Pattern-measuring device (CD-SEM)

The invention claimed is:

1. A process condition estimating apparatus comprising a processor and memory for estimating a process condition in which an object is processed, the apparatus comprising:
   an input unit configured to input measurement data, that has a number of dimensions greater than a number of types of process conditions, acquired at a predetermined position of the processed object; and
   an estimation unit configured to estimate the process condition from the measurement data, by performing dimension reduction to same number of dimensions as the number of types of the process conditions, based on a process-condition-estimating function for inputting the measurement data and outputting an estimation value of the process condition.

2. The apparatus of claim 1, wherein
the estimation unit is further configured to evaluate a space between the process conditions after the dimension reduction.

3. The apparatus of claim 1, wherein
the estimation unit is further configured to calculate feature amounts from the measurement data.

4. The apparatus of claim 1, wherein
the estimation unit is further configured to calculate an accuracy of the estimated process condition.

5. The apparatus of claim 1, wherein
the process-condition-estimating function is created by a neural network.

6. The apparatus of claim 1, wherein
the input unit is further configured to set a specific portion of the measurement data;
the process-condition-estimating function is a function for inputting the specific portion and outputting the estimation value of the process condition; and
the estimation unit is further configured to estimate the process condition from the specific portion based on the process-condition-estimating function.

7. The apparatus of claim 6, wherein
the specific portion includes a region that changes depending on the process condition.

8. The apparatus of claim 1, wherein
the process-condition-estimating function is re-learned.

9. The apparatus of claim 1, wherein
the apparatus further comprises a display unit configured to display the estimated process condition.

10. The apparatus of claim 1, wherein
the measurement data is an image.

11. The apparatus of claim 1, wherein
the process conditions include focus and/or dose of an exposure device.

12. The apparatus of claim 1, wherein
the process conditions include a thickness and/or etching conditions relating to a thin film formed on the object.

13. A calculating method for estimating a process condition in which an object is processed, the method comprising:
   inputting measurement data, that has a number of dimensions greater than a number of types of the process conditions, acquired at a predetermined position of the processed object; and
   estimating the process condition from the measurement data, by performing dimension reduction to same number of dimensions as the number of types of the process conditions, based on a process-condition-estimating function for inputting the measurement data and outputting an estimation value of the process condition.

14. A process condition estimating program for estimating a process condition in which an object is processed and executed by a computer, wherein the process condition estimating program is stored in a non-transitory computer readable medium, comprising:
   a step of inputting measurement data, that has a number of dimensions greater than a number of types of the process conditions, acquired at a predetermined position of the processed object; and
   a step of estimating the process condition from the measurement data, by performing dimension reduction to same number of dimensions as the number of types of the process conditions, based on a process-condition-estimating function for inputting the measurement data and outputting an estimation value of the process condition.

15. The apparatus of claim 1, wherein the number of the types of the processing conditions is plural, and one processing condition for processing the object is one point in a coordinate space having the same dimension as the number of the types of the processing conditions.

* * * * *